(12) United States Patent
Chen et al.

(10) Patent No.: US 11,195,840 B2
(45) Date of Patent: Dec. 7, 2021

(54) METHOD AND STRUCTURES PERTAINING TO IMPROVED FERROELECTRIC RANDOM-ACCESS MEMORY (FERAM)

(71) Applicant: Taiwan Semiconductor Manufacturing Co., Ltd., Hsin-Chu (TW)

(72) Inventors: Tzu-Yu Chen, Kaohsiung (TW); Kuo-Chi Tu, Hsin-Chu (TW); Sheng-Hung Shih, Hsinchu (TW); Wen-Ting Chu, Kaohsiung (TW); Yong-Shiuan Tsair, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 29 days.

(21) Appl. No.: 16/452,965

(22) Filed: Jun. 26, 2019

(65) Prior Publication Data
US 2020/0105772 A1    Apr. 2, 2020

Related U.S. Application Data

(60) Provisional application No. 62/738,604, filed on Sep. 28, 2018.

(51) Int. Cl.
*H01L 27/11507* (2017.01)
*H01L 49/02* (2006.01)

(52) U.S. Cl.
CPC ........ *H01L 27/11507* (2013.01); *H01L 28/60* (2013.01)

(58) Field of Classification Search
CPC .............. H01L 27/11507; H01L 28/60; H01L 27/11502
See application file for complete search history.

(56) References Cited

U.S. PATENT DOCUMENTS

| | | | |
|---|---|---|---|
| 2001/0023952 A1 | 9/2001 | Suenaga et al. | |
| 2002/0105018 A1 | 8/2002 | Tohda | |
| 2003/0218202 A1* | 11/2003 | Sato | H01L 28/60 257/306 |
| 2004/0084701 A1 | 5/2004 | Kanaya et al. | |

(Continued)

OTHER PUBLICATIONS

Yeh et al. ("High temperature reactive ion etching of iridium thin films with aluminum mask in CF4/O2/Ar plasma," AIP Advances, 6, 085111, 2016) (Year: 2016).*

*Primary Examiner* — Yasser A Abdelaziez
(74) *Attorney, Agent, or Firm* — Eschweiler & Potashnik, LLC

(57) ABSTRACT

Some embodiments relate to a ferroelectric random access memory (FeRAM) device. The FeRAM device includes a bottom electrode structure and a top electrode overlying the ferroelectric structure. The top electrode has a first width as measured between outermost sidewalls of the top electrode. A ferroelectric structure separates the bottom electrode structure from the top electrode. The ferroelectric structure has a second width as measured between outermost sidewalls of the ferroelectric structure. The second width is greater than the first width such that the ferroelectric structure includes a ledge that reflects a difference between the first width and the second width. A dielectric sidewall spacer structure is disposed on the ledge and covers the outermost sidewalls of the top electrode.

20 Claims, 8 Drawing Sheets

(56) References Cited

U.S. PATENT DOCUMENTS

| | | |
|---|---|---|
| 2004/0164050 A1 | 8/2004 | Egger et al. |
| 2004/0185634 A1* | 9/2004 | Lim ................. H01L 28/57 |
| | | 438/396 |
| 2005/0205911 A1 | 9/2005 | Udayakumar et al. |
| 2006/0008965 A1 | 1/2006 | Aggarwal et al. |
| 2006/0244023 A1 | 11/2006 | Kanaya |
| 2006/0273367 A1* | 12/2006 | Wang ............... H01L 27/11502 |
| | | 257/295 |
| 2007/0281422 A1 | 12/2007 | Udayakumar et al. |
| 2008/0157050 A1 | 7/2008 | Chen |
| 2008/0265298 A1* | 10/2008 | Ozaki ............... H01L 27/11502 |
| | | 257/295 |
| 2009/0134379 A1 | 5/2009 | Kakegawa |
| 2014/0284736 A1* | 9/2014 | Toko ................. H01L 43/12 |
| | | 257/421 |
| 2015/0069480 A1* | 3/2015 | Kanaya ............... G11C 11/16 |
| | | 257/295 |
| 2015/0072441 A1 | 3/2015 | Sun |
| 2016/0056376 A1 | 2/2016 | Horii et al. |
| 2016/0225979 A1 | 8/2016 | Hsu et al. |
| 2018/0096717 A1 | 4/2018 | Jiang et al. |

\* cited by examiner

METHOD AND STRUCTURES PERTAINING TO IMPROVED FERROELECTRIC RANDOM-ACCESS MEMORY (FERAM)

REFERENCE TO RELATED APPLICATION

This Application claims the benefit of U.S. Provisional Application No. 62/738,604, filed on Sep. 28, 2018, the contents of which are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
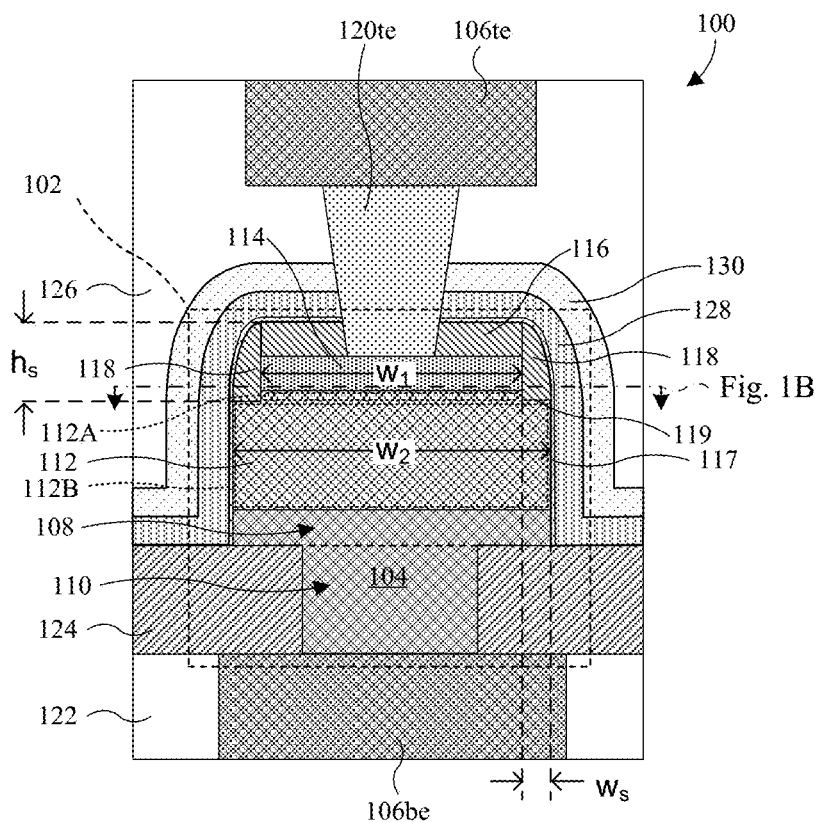
FIG. 1A illustrates a cross-sectional view of some embodiments of an integrated circuit (IC) comprising a FeRAM cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-transistor one-capacitor (1T1C) memory cell is a type of memory comprising a capacitor and a transistor. The capacitor stores varying levels of charge which correspond to an individual bit of data stored in the capacitor, and the transistor facilitates access to the capacitor for read and write operations. The relatively simple structure of the 1T1C memory cell allows high memory density, which leads to high memory capacity and a low cost per bit. 1T1C memory cells are typically used with dynamic random-access memory (DRAM). However, DRAM is reaching performance limits, is volatile, has high power consumption, and depends upon complex refresh circuitry. Volatile memory is electronic memory that is unable to store data in the absence of power. A promising alternative to DRAM is ferroelectric random-access memory (FeRAM). In contrast with DRAM, FeRAM has lower power consumption, the potential for better performance, does not depend upon complex refresh circuitry, and is non-volatile.

FeRAM memory cells include a transistor and a ferroelectric capacitor structure, which includes a ferroelectric structure sandwiched between a top electrode and a bottom electrode. The FeRAM memory cell is configured to store a bit of data, depending on how atoms are aligned relative to one another in the ferroelectric capacitor structure. For example, a first state of the FeRAM memory cell in which atoms in the ferroelectric structure are polarized in an "up" direction may represent a binary value of "1", whereas a second state of the FeRAM memory cell in which atoms in the ferroelectric structure are polarized in a "down" direction may represent a binary value of "0", or vice versa.

As appreciated in some aspects of the present disclosure, however, during manufacture of some FeRAM cells, an etching process can cause reliability concerns. In particular, during manufacture, a bottom electrode layer is formed, a ferroelectric layer is formed over the bottom electrode layer, and a top electrode layer is formed over the ferroelectric layer; and a mask is formed over the top electrode layer. Then, with the mask in place, an etch is carried out to etch through the top electrode layer, ferroelectric layer, and bottom electrode layer to form the top electrode, ferroelectric structure, and bottom electrode. As the inventors have appreciated, this etch can cause atoms which are removed from these layers as the etch progresses to inadvertently redeposit as conductive residue on the sidewalls of the ferroelectric structure. This conductive residue can ultimately short the bottom electrode to the top electrode, leading to failure and/or inoperability of the FeRAM device.

Thus, the present disclosure uses a dielectric sidewall spacer structure disposed along outer sidewalls of the top electrode. This dielectric sidewall spacer structure acts as an electrical barrier to prevent conductive residue which arises during manufacture of the device from shorting the bottom electrode to the top electrode. Thus, this dielectric sidewall spacer and corresponding manufacturing process help improve yield for FeRAM devices.

With reference to FIG. 1A, a cross-sectional view 100 of some embodiments of an IC comprising a ferroelectric capacitor structure 102 is provided. In some embodiments, the ferroelectric capacitor structure 102 includes a ferroelectric structure 112 disposed between a bottom electrode structure 104 and a top electrode 114. With this structure, the ferroelectric capacitor structure 102 is configured to store a bit of data. For example, a first state of the ferroelectric capacitor structure 102 in which atoms in the ferroelectric structure 112 are polarized in an "up" direction may represent a binary value of "1", whereas a second state of the ferroelectric capacitor structure 102 in which atoms in the ferroelectric structure 112 are polarized in an "down" direction may represent a binary value of "0", or vice versa.

The bottom electrode structure 104 overlies and is electrically coupled to a bottom electrode wire 106be. The bottom electrode wire 106be may be or comprise, for example, aluminum copper, copper, aluminum, some other suitable conductive material(s), or any combination of the foregoing. As used herein, a term with a suffix of "(s)" may, for example, be singular or plural. In some embodiments, the bottom electrode structure 104 has a T-shaped profile or some other suitable profile. In some embodiments, the bottom electrode structure 104 is homogeneous (e.g., where the entire body of the bottom electrode structure 104 is a single material). In other embodiments, the bottom electrode structure 104 is heterogeneous (e.g., where the body of the bottom electrode structure 104 includes multiple layers and/or materials). The bottom electrode structure 104 may be or comprise, for example, titanium nitride, tantalum nitride, titanium, tantalum, platinum, iridium, ruthenium, tungsten, silver, copper, nickel, some other suitable conductive material(s), or any combination of the foregoing. The bottom electrode structure 104 comprises a bottom electrode 108 and a bottom electrode via 110. For example, the bottom electrode 108 and the bottom electrode via 110 may be individual regions of the bottom electrode structure 104.

The bottom electrode 108 is electrically coupled to the bottom electrode wire 106be by the bottom electrode via 110 extending from the bottom electrode 108 to the bottom electrode wire 106be. In some embodiments, the ferroelectric structure includes an upper ferroelectric portion 112A having the first width, a lower ferroelectric portion 112B having the second width, and a ledge 119 corresponding to a height where the upper ferroelectric portion 112A meets the lower ferroelectric portion 112B. Thus, FIG. 1A illustrates an example where the bottom electrode 108 and ferroelectric structure 112 each have a first width, w1, and the top electrode has a second width, w2, wherein w2 is greater than w1. In some embodiments, the first width is approximately 10 nm, and the second width is approximately 12 nm. In various embodiments, the first width ranges from approximately 50% to approximately 95% of the second width. Further, in some cases, the width of the bottom electrode 108 is uniform or substantially uniform, and/or the width of the bottom electrode via 110 is uniform or substantially uniform. In some embodiments, the bottom electrode 108 and the bottom electrode via 110 are or comprise the same material(s). In other embodiments, the bottom electrode 108 and the bottom electrode via 110 are different materials. In some embodiments, the bottom electrode 108 and the bottom electrode via 110 are integrated together and/or are continuous with each other. In other embodiments, the bottom electrode 108 and the bottom electrode via 110 are independent and/or distinct from each other.

The ferroelectric structure 112 overlies the bottom electrode structure 104. The ferroelectric structure 112 may be or comprise, for example, strontium bismuth tantalite (e.g., SBT), lead zirconate titanate (e.g., PZT), hafnium zirconium oxide (e.g., HZO), doped hafnium oxide (e.g., Si:HfO2), some other suitable ferroelectric material(s), or any combination of the foregoing. The doped hafnium oxide may, for example, be doped with zirconium, silicon, yttrium, aluminum, gadolinium, lanthanum, strontium, some other suitable element(s), or any combination of the foregoing. The ferroelectric structure 112 is configured to store a bit of data. For example, in a first state atoms in the ferroelectric structure 112 are polarized in an "up" direction may represent a binary value of "1", whereas in a second state atoms in the ferroelectric structure 112 are polarized in an "down" direction may represent a binary value of "0", or vice versa.

A top electrode 114 overlies the ferroelectric structure 112. The top electrode 114 may be or comprise, for example, titanium nitride, tantalum nitride, titanium, tantalum, platinum, iridium, ruthenium, tungsten, silver, copper, nickel, some other suitable conductive material(s), or any combination of the foregoing. The top electrode has a first width $w_1$, as measured between its outermost sidewalls, and the ferroelectric structure has a second width $w_2$, as measured between its outermost sidewalls. The second width is greater than the first width, such that the ferroelectric structure includes ledge 119 that reflects a difference between the first width and the second width.

In some embodiments, a hard mask 116 overlies the top electrode 114. The hard mask 116 may, for example, serve as a mask during formation of the top electrode 114, the ferroelectric structure 112, and the bottom electrode 108. Further, the hard mask 116 may, for example, be or comprise silicon nitride, silicon oxynitride, some other suitable dielectric(s), or any combination of the foregoing.

Figure 1B:
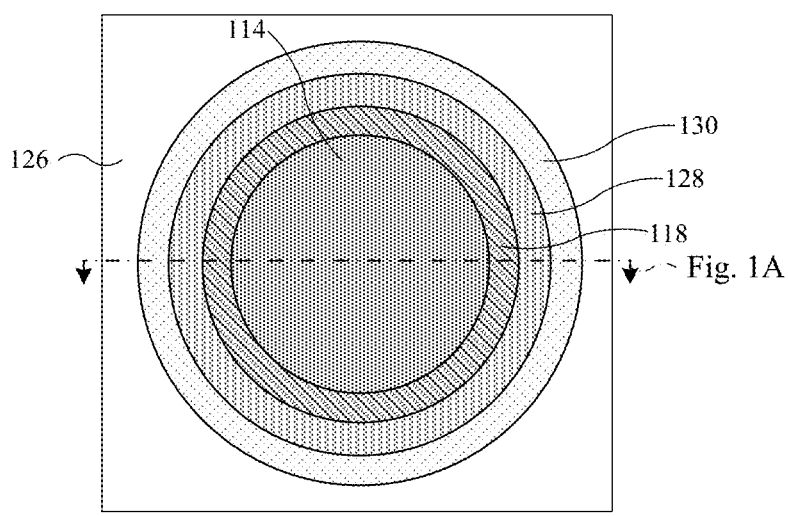
FIG. 1B illustrates a top view of some embodiments of an integrated circuit (IC) comprising a FeRAM cell consistent with FIG. 1A.

A dielectric sidewall spacer structure 118 is on outer sidewalls of the ferroelectric structure 112, and may extend partially into an upper surface of the ferroelectric structure 112. A bottom surface of the dielectric sidewall spacer structure rests on the ledge 119 and is spaced apart from an upper surface of the bottom electrode 108. When viewed in cross-section, the dielectric sidewall spacer structure 118 comprises a pair of spacer segments and the spacer segments are respectively on opposite outer sides of the ferroelectric structure 112. The spacer segments have curved upper sidewalls. In FIG. 1A's cross-section it can be seen that the spacer segments have inner sidewalls that are vertical and outer sidewalls that are rounded and/or tapered. The dielectric sidewall spacer structure 118 may have a height, $h_s$, ranging from approximately 50 angstroms to approximately 500 angstroms, and may have a bottom surface on ledge 119, which can correspond to bottom surface of 114 or which can be below bottom surface of 114 and within the ferroelectric structure 112. Each spacer segment of the dielectric sidewall spacer structure 118 may have a width, $w_s$, ranging from approximately 50 angstroms to approximately 500 angstroms, and the ratio of the width, $w_s$, to width, $w_1$, ($w_s:w_1$) can range from 1:20 to 2:1 in some embodiments, though other values are within the scope of this disclosure for this example and other examples in the present application. As can be seen from the top view of FIG. 1B, when viewed from above, in some embodiments the dielectric sidewall spacer structure 118 can be a continuous spacer that laterally surrounds an outer sidewall of the top electrode 114. The dielectric sidewall spacer structure 118 may, for example, be or comprise silicon nitride, silicon oxide, some other suitable dielectric(s), or any combination of the foregoing. In some embodiments, the dielectric sidewall spacer structure 118 and the hard mask 116 are or comprise the same material(s).

As shown in FIG. 1A, in some embodiments, a conductive residue 117 may be formed on outer sidewalls of the dielectric sidewall spacer structure 118 and may be in direct physical and electrical contact with the bottom electrode 108. The conductive residue 117 is spaced apart from and isolated from outer sidewalls of the top electrode 114 by the dielectric sidewall spacer structure 118, such that the dielectric sidewall spacer structure 118 prevents the conductive residue 117, if any, from shorting the top electrode 114 to the bottom electrode structure 104. Thus, the conductive residue 117 includes chemical species contained in the ferroelectric layer and/or the bottom electrode layer, which were re-deposited the along outermost sidewalls of the dielectric sidewall spacer structure during manufacturing. The conductive residue 117 may be a continuous layer in some cases, but may be "patchy" or discontinuous over the underlying surfaces in other cases. For example, in some cases the conductive residue 117 can be a fully formed sheet with an even or uneven thickness that covers the top surface of mask 116, upper and sidewall surfaces of dielectric sidewall spacer structure 118, outer sidewalls of ferroelectric structure 112, and outer sidewalls of bottom electrode 108. In other embodiments, the conductive residue 117 can be patchy in that the conductive residue 117 covers some but not all portions of the top surface of mask 116, upper and sidewall surfaces of dielectric sidewall spacer structure 118, outer sidewalls of ferroelectric structure 112, and outer sidewalls of bottom electrode 108; for example, covering more than 1% but less than 100% of those underlying surfaces, though other values are within the scope of this disclosure for this example and other examples in the present application.

In some embodiments, a first dielectric liner 128 and/or a second dielectric liner 130 laterally surround the dielectric sidewall spacer structure 118, the ferroelectric structure 112, and the bottom electrode 108. The first dielectric liner 128 may, for example, serve as an etch stop during formation of adjoining vias and/or may, for example, be or comprise silicon carbide, some other suitable dielectric(s), or any combination of the foregoing. The second dielectric liner 130 may be or comprise, for example, TEOS silicon dioxide, some other suitable dielectric(s), or any combination of the foregoing.

A top electrode wire 106te and a top electrode via 120te overlie the top electrode 114. The top electrode via 120te extends from the top electrode wire 106te to the top electrode 114 to electrically couple the top electrode wire 106te to the top electrode 114. In some embodiments, the top electrode wire 106te and the top electrode via 120te are the same material. In other embodiments, the top electrode wire 106te and the top electrode via 120te are different materials. In some embodiments, the top electrode wire 106te and the top electrode via 120te are integrated together and/or are continuous with each other. In other embodiments, the top electrode wire 106te and the top electrode via 120te are independent and/or distinct from each other.

The bottom and top electrode wires 106be, 106te, the top electrode via 120te, and the ferroelectric capacitor structure 102 are surrounded by a dielectric structure. The dielectric structure comprises a lower interconnect dielectric layer 122, a via dielectric layer 124 overlying the lower interconnect dielectric layer 122, and an upper interconnect dielectric layer 126 overlying the via dielectric layer 124. The dielectric structure may be or comprise, for example, tetraethyl orthosilicate (TEOS) silicon dioxide, some other suitable silicon dioxide, silicon oxynitride, a low κ dielectric, silicon carbide, silicon nitride, some other suitable dielectric(s), or any combination of the foregoing. As used herein, a low κ dielectric may be, for example, a dielectric with a dielectric constant κ less than about 3.9, 3, 2, or 1. In some embodiments, the lower and upper interconnect dielectric layers 122, 126 are or comprise silicon oxide, a low κ dielectric, some other suitable dielectric(s), or any combination of the foregoing, and/or the via dielectric layer 124 is or comprises silicon carbide, silicon nitride, silicon oxynitride, some other suitable dielectric(s), or any combination of the foregoing.

Figure 2:
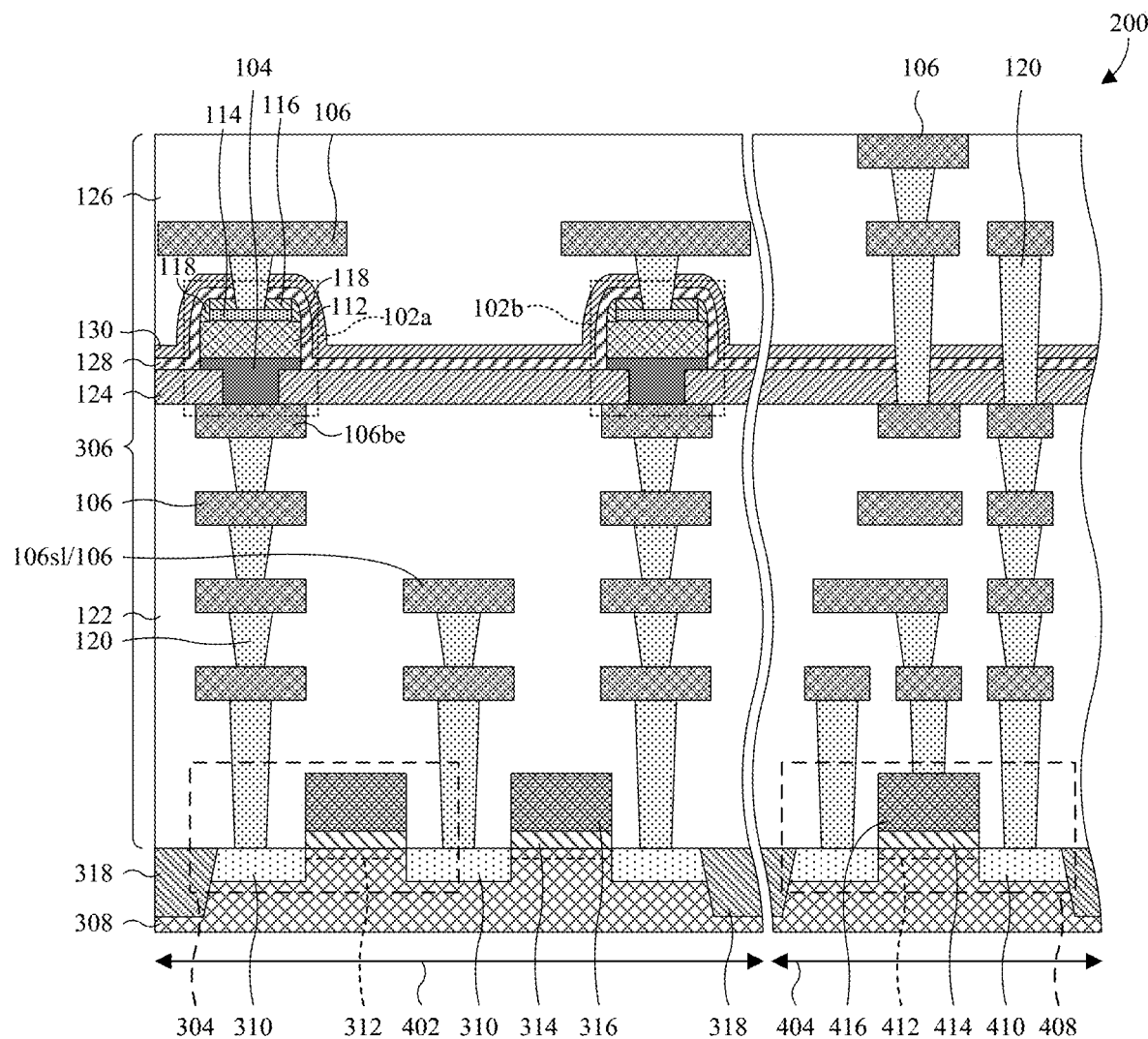
FIG. 2 illustrates cross-sectional views of various embodiments of an IC comprising a memory area with one or more FeRAM cells, and a peripheral area including logic circuitry spaced apart from the memory area.

With reference to FIG. 2, a cross-sectional view 200 of some embodiments of an IC is provided. The IC includes a memory region 402 including one or more ferroelectric capacitor structure, and a peripheral region 404 including one or more logic devices.

Within the memory region 402, the ferroelectric capacitor structure 102 of FIG. 1 FIG. 1A defines a first memory capacitor structure 102a and a second memory capacitor structure 102b. The first memory capacitor structure 102a overlies and is electrically coupled to an access transistor 304 by an interconnect structure 306. Thus, this is an example configuration of a ferroelectric random access memory (FeRAM) device. The access transistor 304 overlies a semiconductor substrate 308 and may be, for example, a metal-oxide-semiconductor field-effect transistor (MOSFET), bipolar junction transistor (BJT), fin field-effect transistor (FinFET), some other suitable insulated-gate field-effect transistor (IGFET), or some other suitable transistor. The semiconductor substrate 308 may be or comprise, for example, a bulk monocrystalline silicon substrate, a silicon-on-insulator (SOI) substrate, or some other suitable semiconductor substrate.

The access transistor 304 comprises a pair of memory source/drain regions 310, a selectively-conductive memory channel 312, a memory gate dielectric layer 314, and a memory gate electrode 316. The memory source/drain regions 310 and the selectively-conductive memory channel 312 are disposed within the semiconductor substrate 308, and the selectively-conductive memory channel 312 extends laterally from one of the memory source/drain regions 310 to another one of the memory source/drain regions 310. The memory gate dielectric layer 314 and the memory gate electrode 316 are stacked over the semiconductor substrate 308 and are sandwiched between the memory source/drain regions 310. The memory gate dielectric layer 314 may be or comprise, for example, silicon oxide, a high-k dielectric layer, some other suitable dielectric(s), or any combination of the foregoing. The memory gate electrode 316 may be or comprise, for example, doped polysilicon, metal, some other suitable conductive material(s), or any combination of the foregoing.

In some embodiments, an isolation structure 318 extends into the top surface of the semiconductor substrate 308 to provide electrical isolation between the access transistor 304 and other semiconductor devices in the semiconductor substrate 308. In some embodiments, the isolation structure 318 laterally surround an active area of the access transistor 304. The isolation structure 318 may be or comprise, for example, a shallow trench isolation (STI) structure, a deep trench isolation (DTI) structure, some other suitable isolation structure(s), or any combination of the foregoing.

The interconnect structure 306 overlies the access transistor 304 and the semiconductor substrate 308. The interconnect structure 306 comprises a dielectric structure, and further comprises a plurality of wires 106 and a plurality of vias 120. For ease of illustration, only some of the wires 106 and vias 120 are labeled while others are not labeled. The dielectric structure comprises the lower interconnect dielectric layer 122, the via dielectric layer 124 overlying the lower interconnect dielectric layer 122, and the upper interconnect dielectric layer 126 overlying the via dielectric layer 124. In some embodiments, the dielectric structure further comprises a first dielectric liner 128 and/or a second dielectric liner 130. The first and/or second dielectric liners 128, 130 further separate the ferroelectric structure 112 and the via dielectric layer 124 from the upper interconnect dielectric layer 126. The first dielectric liner 128 may, for example, serve as an etch stop during formation of adjoining vias and/or may, for example, be or comprise silicon carbide, some other suitable dielectric(s), or any combination of the foregoing. The second dielectric liner 130 may be or comprise, for example, TEOS silicon dioxide, some other suitable dielectric(s), or any combination of the foregoing.

The plurality of wires 106 comprise the bottom and top electrode wires 106*be*, 106*te*, and the plurality of vias 120 comprise the top electrode via 120*te*. The wires 106 and the vias 120 are alternatingly stacked in the dielectric structure to define conductive paths, one of which electrically couples the bottom electrode wire 106*be* to one of the memory source/drain regions 310. Further, the wires 106 and the vias 120 are respectively grouped into wire levels and via levels. A wire level is a set of wires with a common height above the semiconductor substrate 308, and a via level is a set of vias with a common height above the semiconductor substrate 308. The top electrode wire 106*te* is in the wire level immediately above the wire level accommodating the bottom electrode wire 106*be*. In some embodiments, as illustrated, the bottom electrode wire 106*be* is in the wire level 4 which may also be referred to as metal4 (M4) in some contexts. However, the bottom electrode wire 106*be* may be in any other wire level/metal layer in other embodiments. For example, the bottom electrode wire 106*be* may be in wire level 1 in other embodiments.

The first memory capacitor structure 102*a*, the access transistor 304, and the electrical interconnections between the first memory capacitor structure 102*a* and the access transistor 304 define a first 1T1C FeRAM memory cell. Note that the electrical interconnections between the first memory capacitor structure 102*a* and the access transistor 304 are defined by the wires 106 and the vias 120. In some embodiments, the first 1T1C FeRAM memory cell is one of many 1T1C FeRAM memory cells arranged in rows and columns to define a memory array. In some of such embodiments, the plurality of wires 106 comprise a source line wire 106*sl* defining a source line of the memory array, the memory gate electrode 316 defines a word line of the memory array, the top electrode wire 106*te* defines a bit line of the memory array, or any combination of the foregoing. The bottom electrode wire 106*be* and the source line wire 106*sl* may, for example, respectively be electrically coupled to the memory source/drain regions 310.

In the peripheral region 404 of the IC, the metals layers of the interconnect structure are spaced at the same spacings or heights as in the memory region 402. The peripheral region 404 includes a logic transistor 408 comprising a pair of logic source/drain regions 410, a selectively-conductive logic channel 412, a logic gate dielectric layer 414, and a logic gate electrode 416. The logic source/drain regions 410 and the selectively-conductive logic channel 412 are disposed within the semiconductor substrate 308, and the selectively-conductive logic channel 412 extends laterally from one of the logic source/drain regions 410 to another one of the logic source/drain regions 410. The logic gate dielectric layer 414 and the logic gate electrode 416 are stacked over the semiconductor substrate 308 and are sandwiched between the logic source/drain regions 410. The logic gate dielectric layer 414 may be or comprise, for example, silicon oxide, a high-k dielectric layer, some other suitable dielectric(s), or any combination of the foregoing. The logic gate electrode 416 may be or comprise, for example, doped polysilicon, metal, some other suitable conductive material(s), or any combination of the foregoing.

With reference to FIGS. 3-13, a series of cross-sectional views 300-1300 illustrate some embodiments of a method for forming an IC comprising a ferroelectric capacitor structure, where the ferroelectric capacitor structure is part of a 1T1C memory cell. The method may, for example, be employed to form the IC in any one of FIGS. 1A-2. While the cross-sectional views 300-1300 shown in FIGS. 3-13 are described with reference to the method, it will be appreciated that the structures shown in FIGS. 3-13 are not limited to the method and may stand alone without the method.

Figure 3:
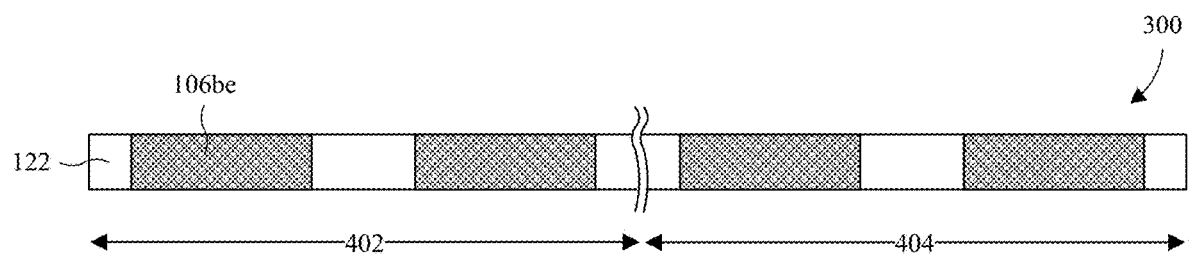
FIGS. 3-13 illustrate a series of cross-sectional views of some embodiments of a method for forming an IC comprising a FeRAM cell.

As illustrated by the cross-sectional view 300 of FIG. 3, the IC includes a memory region 402 corresponding to one or more ferroelectric capacitor structures, and a peripheral region 404 corresponding to one or more logic devices. Note that for drawing compactness, a lower portion of the IC (shown in FIG. 2) is omitted in FIGS. 3-13. A planarization is performed into the top surface of the lower interconnect dielectric layer 122 and top surfaces respectively of wires (e.g., 106*be* in FIG. 1A) along the top surface of the lower interconnect dielectric layer 122, such that the top surface of the lower interconnect dielectric layer 122 is even or about even with the top surfaces respectively of the wires along the top surface of the lower interconnect dielectric layer 122. The planarization may, for example, be performed by CMP, some other suitable planarization process(es), or any combination of the foregoing.

Figure 4:
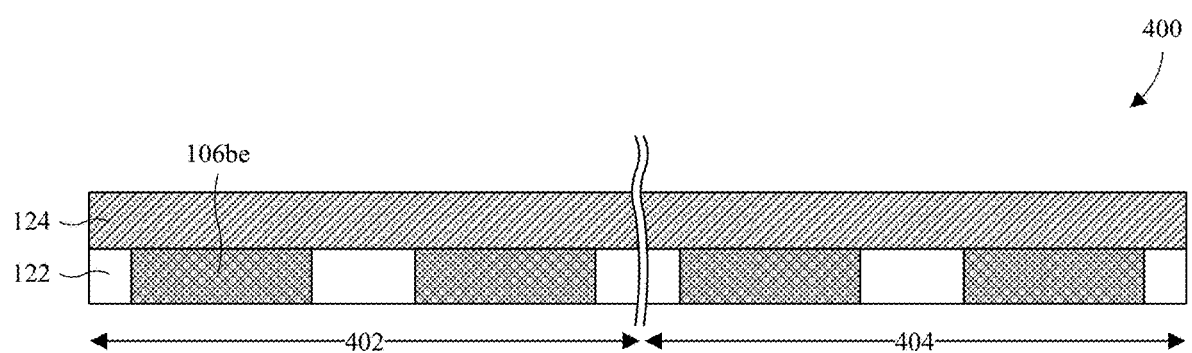

As illustrated by the cross-sectional view 400 of FIG. 4, a via dielectric layer 124 is formed covering the lower interconnect dielectric layer 122. The via dielectric layer 124 may be or comprise, for comprise, silicon carbide, silicon nitride, some other suitable dielectric(s), or any combination of the foregoing. The via dielectric layer 124 may, for example, be formed by chemical vapor deposition (CVD), physical vapor deposition (PVD), suitable other suitable deposition process(es), or any combination of the foregoing.

Figure 5:
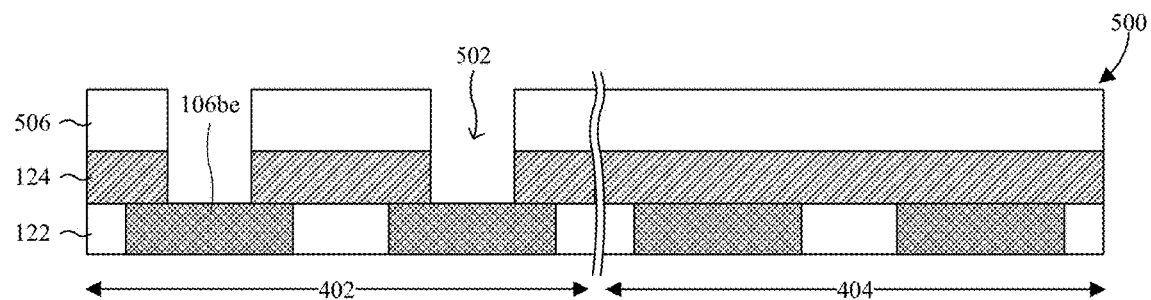

As illustrated by the cross-sectional view 500 of FIG. 5, the via dielectric layer 124 is patterned to form a plurality of memory openings 502. The memory openings 502 respectively overlie and expose the bottom electrode wires 106*be*. In some embodiments, the patterning is performed by an etching process, some other suitable patterning process(es), or any combination of the foregoing. In some embodiments, the etching process comprises forming a mask 506 on the via dielectric layer 124, performing an etch into the via dielectric layer 124 with the mask 506 in place, and removing the mask 506 after the etch. The mask 506 may, for example, be or comprise photoresist, silicon nitride, some other suitable mask material(s), or any combination of the foregoing.

Figure 6:
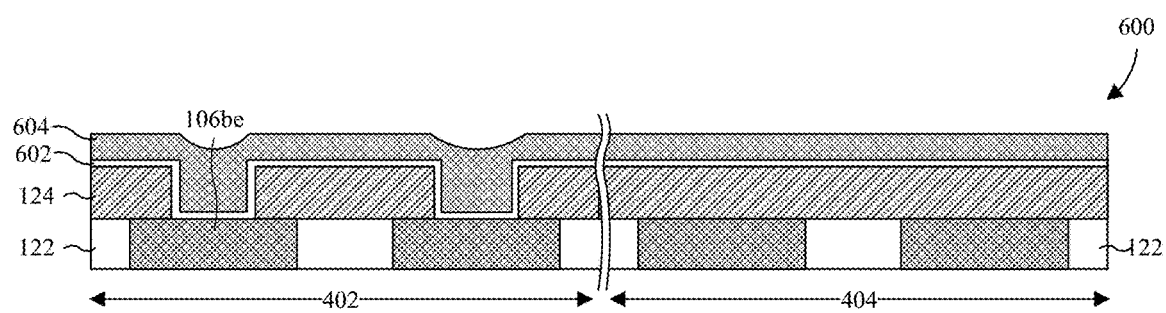

As illustrated by the cross-sectional view 600 of FIG. 6, a conductive liner layer 602 is formed covering the via dielectric layer 124 and lining the memory openings 502 (see FIG. 5). Further, a lower conductive body layer 604 is formed covering the conductive liner layer 602 and filling the memory openings 502. The conductive liner layer 602 and lower conductive body layer 604 wholly or partially define bottom electrode vias 110 in the memory openings

502. Further, the conductive liner layer 602 is configured to block material from the lower conductive body layer 604 from moving away from the lower conductive body layer 604 to surrounding structure. The conductive liner layer 602 may be or comprise, for example, titanium nitride, titanium, tantalum nitride, tantalum, some other suitable conductive barrier material(s) for the lower conductive body layer 604, or any combination of the foregoing. The lower conductive body layer 604 may be or comprise, for example, titanium nitride, tantalum nitride, platinum, iridium, ruthenium, tungsten, silver, copper, nickel, some other suitable conductive material(s), or any combination of the foregoing. The conductive liner layer 602 and the lower conductive body layer 604 may, for example, be formed by CVD, PVD, electroless plating, electroplating, sputtering, some other suitable deposition process(es), or any combination of the foregoing.

Figure 7:
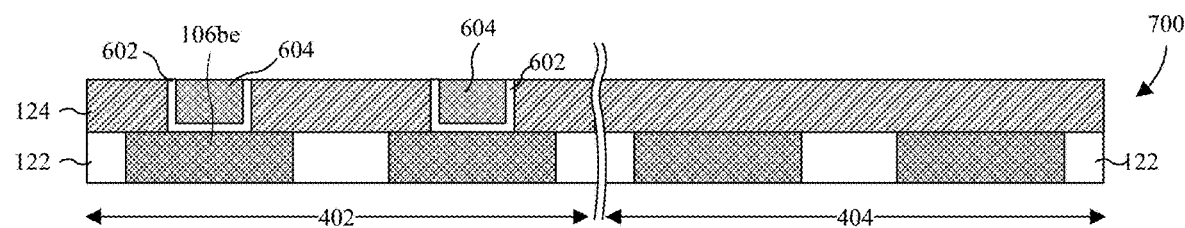

As illustrated by the cross-sectional view 700 of FIG. 7, a planarization is performed into top surfaces respectively of the conductive liner layer 602 (see FIG. 6) and the lower conductive body layer 604 (see FIG. 6) until a top surface of the via dielectric layer 124 is reached. The planarization may, for example, be performed by CMP, some other suitable planarization process(es), or any combination of the foregoing.

Figure 8:
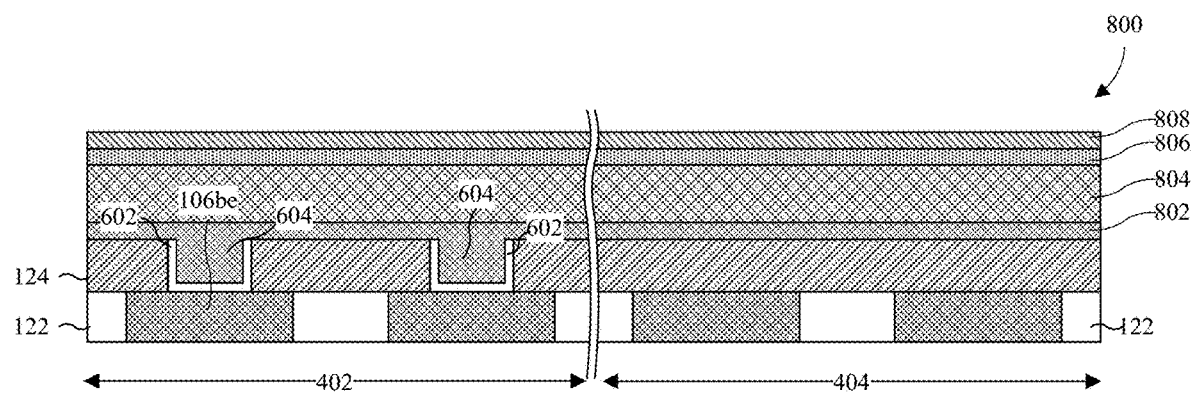

As illustrated by the cross-sectional view 800 of FIG. 8, an upper conductive body layer 802, a ferroelectric layer 804, a top electrode layer 806, and a hard mask layer 808 are formed on the via dielectric layer 124 and the lower conductive body layer 604. The upper conductive body layer 802 may be or comprise, for example, titanium nitride, tantalum nitride, platinum, iridium, ruthenium, tungsten, silver, copper, nickel, some other suitable conductive material(s), or any combination of the foregoing. Often, the upper conductive body layer 802 is the same material as the lower conductive body layer 604, but these could be different materials in alternative embodiments. The ferroelectric layer 804 may be or comprise, for example, strontium bismuth tantalite, lead zirconate titanate, hafnium zirconium oxide, doped hafnium oxide, some other suitable ferroelectric material(s), or any combination of the foregoing. The top electrode layer 806 may be or comprise, for example, titanium nitride, tantalum nitride, platinum, iridium, ruthenium, tungsten, silver, copper, nickel, some other suitable conductive material(s), or any combination of the foregoing. The hard mask layer 808 may be or comprise, for example, silicon nitride, silicon oxynitride, silicon oxide, some other suitable dielectric(s), or any combination of the foregoing.

A process for forming the stack may, for example, comprise depositing the upper conductive body layer 802, subsequently depositing the ferroelectric layer 804, subsequently depositing the top electrode layer 806, and subsequently depositing the hard mask layer 808. The upper conductive body layer 802, the ferroelectric layer 804, the top electrode layer 806, and the hard mask layer 808 may, for example, be deposited by CVD, PVD, ALD, electroless plating, electroplating, some other suitable deposition process(es), or any combination of the foregoing.

Figure 9:
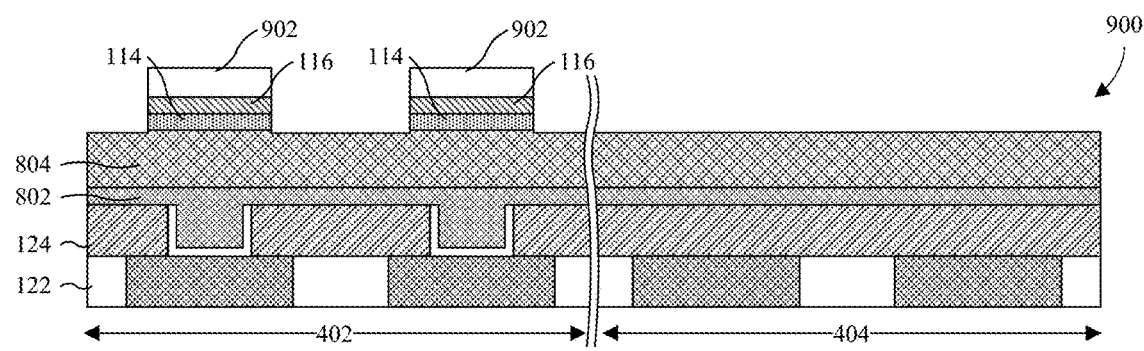

As illustrated by the cross-sectional view 900 of FIG. 9, the top electrode layer 806 (see FIG. 8), and the hard mask layer 808 (see FIG. 8) are patterned to form top electrodes 114 and hard masks 116. This etch may extend into the upper surface of the ferroelectric layer 804, for example ranging from 5% to approximately 30% into the depth of the ferroelectric layer 804 in some embodiments, to establish a ledge (see e.g., ledge 119 in FIG. 1A).

The patterning may, for example, be performed by an etching process, some other suitable patterning process(es), or any combination of the foregoing. The etching process may, for example, comprises: forming a mask 902 on the hard mask layer 116; performing an etch into the top electrode layer and the hard mask layer with the mask in 902 place; thereby forming top electrodes 114 and hard mask 116. The mask 902 can be removed after the etch. The mask 902 may, for example, be or comprise photoresist, a hardmask and/or some other suitable mask material(s), or any combination of the foregoing.

Figure 10:
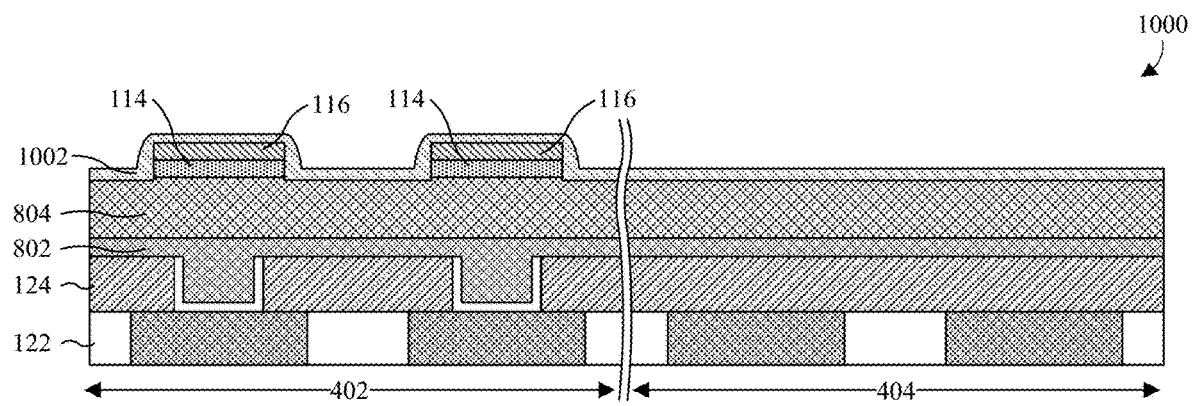

As illustrated by the cross-sectional view 1000 of FIG. 10, a dielectric spacer layer 1002, such as silicon nitride or silicon oxynitride, is formed over an upper surface of the ferroelectric structure 112 along sidewalls of top electrodes 114, and along sidewalls and over upper surfaces of hard masks 116. The dielectric spacer layer 1002 is thus a continuous dielectric layer over the structure of FIG. 9, and is generally conformal.

Figure 11:
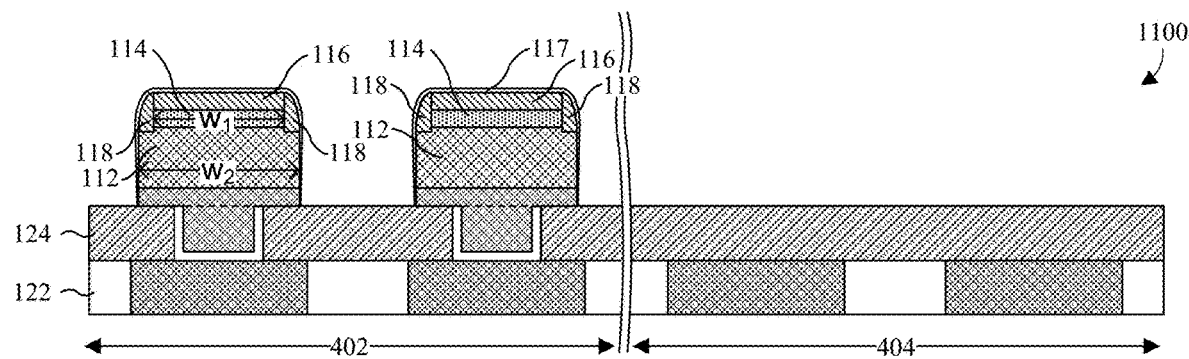

As illustrated by the cross-sectional view 1100 of FIG. 11, the dielectric spacer layer (see e.g., 1002 in FIG. 10) is etched back using a first etch, such as a dry etch or plasma etch with a strong vertical component, typically without an additional mask being formed after the dielectric spacer layer has been formed. Thus, this etch removes lateral portions of the dielectric spacer layer (see e.g., 1002 in FIG. 10), thereby leaving the dielectric sidewall spacer structure 118 in place after the etch. A second etch is then performed with the dielectric sidewall spacer structure 118 in place to remove exposed portions of the ferroelectric layer (see e.g., 804 in FIG. 8) and the upper conductive body layer (see e.g., 802 in FIG. 8). This etch may cause conductive residue 117, which comprises chemical species that are etched/removed from the ferroelectric layer 804 and/or the upper conductive body 802, to form on outer sidewalls of the bottom electrode, outer sidewalls of the ferroelectric layer, and/or outer sidewalls of dielectric sidewall spacer structure 118, as well as on upper surface of the dielectric sidewall spacer structure 118 and upper surface of the hard mask 116. But for the dielectric sidewall spacer structure 118, this conductive residue could short the top electrode and bottom electrode to one another, resulting in inoperability of the device. In some cases, rather than being a continuous layer, the conductive residue 117 can be "spotty" or "patchy", covering some portions of the exposed structure but not covering other portions of the exposed structure. Further, the conductive residue 117 may be thicker toward the top of the dielectric spacer structure 118 and thinner toward the bottom electrode, due to the manner in which the etch and re-deposition of the conductive residue proceed from top of the structure to bottom of the structure, though other structures are within the scope of this disclosure for this example and other examples in the present application.

Figure 12:
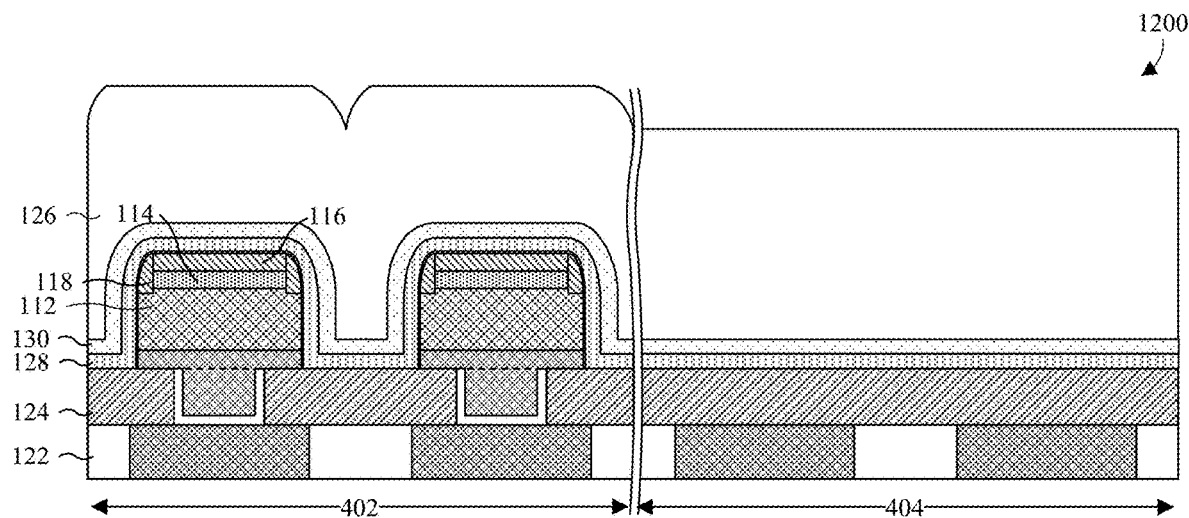

As illustrated by the cross-sectional view 1200 of FIG. 12, a first dielectric liner 128, and a second dielectric liner 130 are formed covering the via dielectric layer 124 and the memory structures. The first dielectric liner 128 may, for example, be or comprise silicon carbide, and the second dielectric liner 130 may comprise TEOS silicon dioxide in some embodiments. An upper interconnect dielectric layer 126 is then formed to cover the first dielectric liner 128 and second dielectric liner 130, and may be or comprise, for example, silicon oxide, a low κ dielectric, some other suitable dielectric(s), or any combination of the foregoing.

Figure 13:
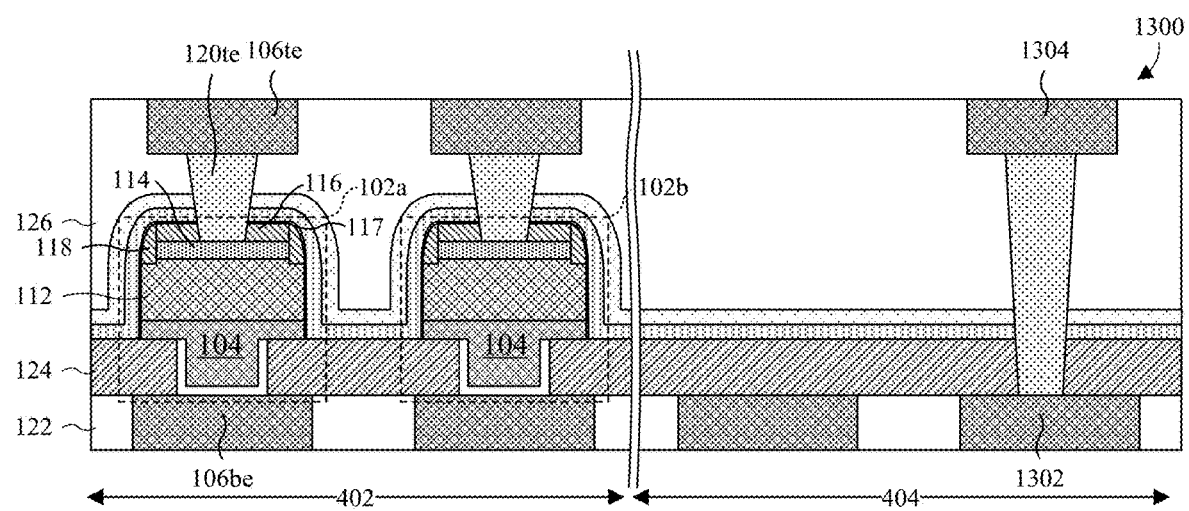

As illustrated by the cross-sectional view 1300 of FIG. 13, a planarization is performed into a top surface of the upper interconnect dielectric layer 126 to flatten the top surface. The planarization may, for example, be performed by CMP, some other suitable planarization process(es), or any combination of the foregoing. Then, openings are formed in the upper interconnect dielectric layer 126, and vias (e.g., 120*te* and 120) and metal wires (e.g., 106*te*, 1304) are formed in the openings. The vias and metal wires may be formed, for example, through a damascene process or a dual damascene process. The vias and metal wires may be or comprise, for example, copper, aluminum, nickel, titanium, tantalum, titanium nitride, tantalum nitride, platinum, iridium, ruthenium, tungsten, silver, some other suitable conductive material(s), or any combination of the foregoing. In the peripheral region 404 of the IC, the metals layers of the interconnect structure can be spaced at the same spacings or heights as in the memory region 402, which simplifies integration of the memory region 402 and peripheral region 404. For example, metal layers 1302, 1304 in the peripheral region 404, can have the same vertical spacing as 106*be* and 106*te* in the memory region 402.

Figure 14:
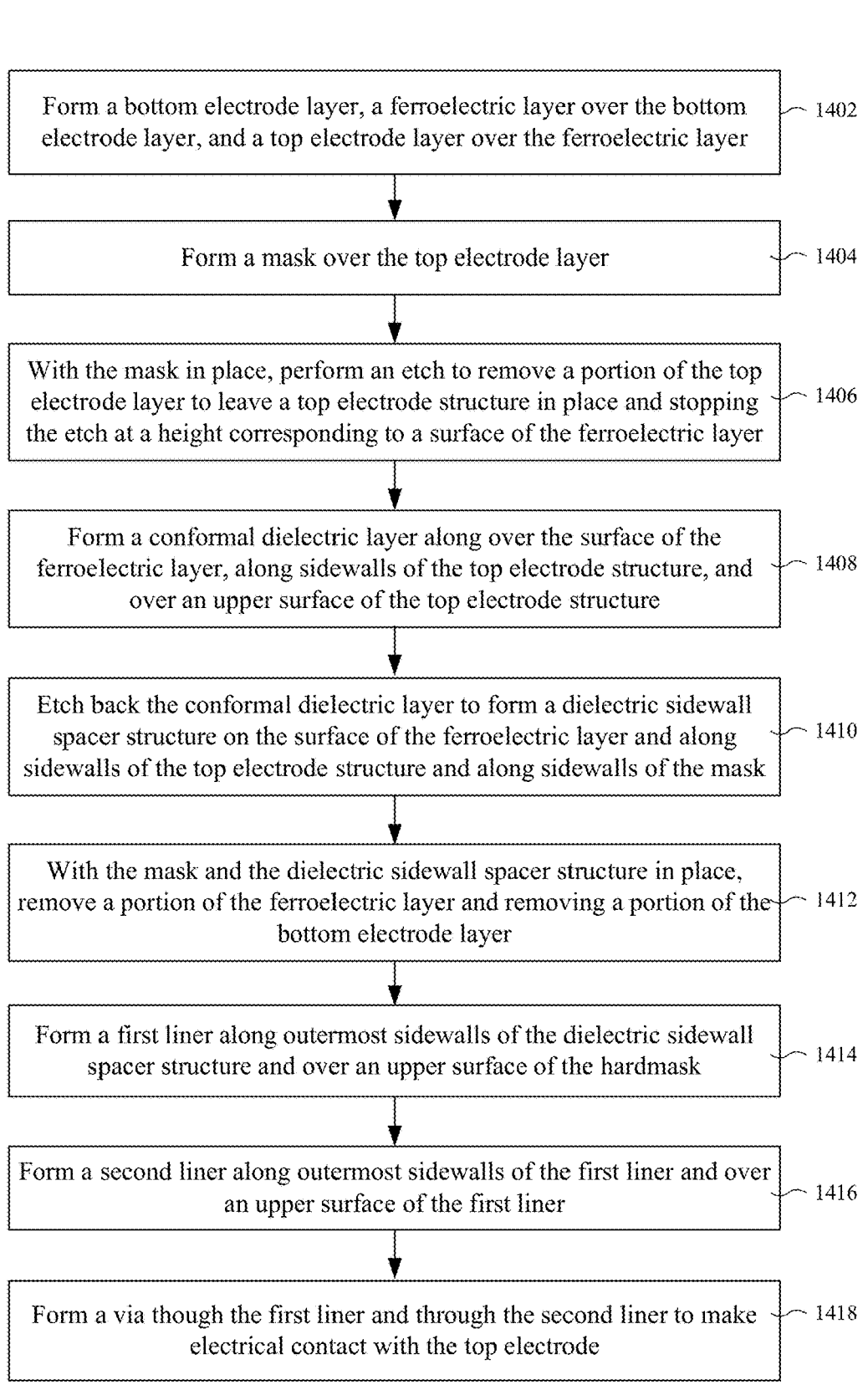
FIG. 14 illustrates some embodiments of a method in flow chart format for forming an IC comprising a FeRAM cell.

FIG. 14 illustrates a method in flowchart format 1400 in accordance with some embodiments.

At act 1402, a bottom electrode layer is formed, and a ferroelectric layer is formed over the bottom electrode layer. A top electrode layer is formed over the ferroelectric layer. In some embodiments, this act can be consistent with all or portions of FIGS. 3-8, for example.

At act 1404, a mask is formed over the top electrode layer. In some embodiments, this act can be consistent with all or portions of FIG. 9, for example.

At act 1406, with the mask in place, an etch is performed to remove a portion of the top electrode layer to leave a top electrode structure in place. The etch is stopped at a height corresponding to a surface of the ferroelectric layer. In some embodiments, this act can be consistent with all or portions of FIG. 9, for example.

At act 1408, a conformal dielectric layer is formed along over the surface of the ferroelectric layer, along sidewalls of the top electrode structure, and over an upper surface of the top electrode structure. In some embodiments, this act can be consistent with all or portions of FIG. 10, for example.

At act 1410, the conformal dielectric layer is etched back to form a dielectric sidewall spacer structure on the surface of the ferroelectric layer and along sidewalls of the top electrode structure and along sidewalls of the mask. In some embodiments, this act can be consistent with all or portions of FIG. 11, for example.

At 1412, with the mask and the dielectric sidewall spacer structure in place, a portion of the ferroelectric layer and a portion of the bottom electrode layer are removed. In some embodiments, this act can be consistent with all or portions of FIG. 11, for example.

At 1414, a first liner is formed along outermost sidewalls of the dielectric sidewall spacer structure and over an upper surface of the hardmask. In some embodiments, this act can be consistent with all or portions of FIG. 12, for example.

At 1416, a second liner is formed along outermost sidewalls of the first liner and over an upper surface of the first liner. In some embodiments, this act can be consistent with all or portions of FIG. 12, for example.

At 1418, a via is formed though the first liner and through the second liner to make electrical contact with the top electrode. In some embodiments, this act can be consistent with all or portions of FIG. 13, for example.

Thus, some embodiments relate to a memory device. The memory device includes a bottom electrode structure and a top electrode overlying the bottom electrode structure. The top electrode has a first width. A ferroelectric structure separates the bottom electrode structure from the top electrode, and the ferroelectric structure has a second width that is greater than the first width such that the ferroelectric structure includes a ledge that reflects a difference between the first width and the second width. A dielectric sidewall spacer structure is disposed on the ledge, and covers outermost sidewalls of the top electrode.

Other embodiments relate to method. In this method, a bottom electrode layer is formed, a ferroelectric layer is formed over the bottom electrode layer, and a top electrode layer is formed over the ferroelectric layer. A mask is formed over the top electrode layer. With the mask in place, an etch is performed to remove a portion of the top electrode layer to leave a top electrode structure in place. The etch stops at a height corresponding to a surface of the ferroelectric layer. A conformal dielectric layer is formed over the surface of the ferroelectric layer, along sidewalls of the top electrode structure, and over an upper surface of the top electrode structure. The conformal dielectric layer is etched back to form a dielectric sidewall spacer structure on the surface of the ferroelectric layer and along sidewalls of the top electrode structure. With the mask and the dielectric sidewall spacer structure in place, a portion of the ferroelectric layer and a portion of the bottom electrode layer are removed.

Further, other embodiments relate to a memory device including a bottom electrode structure, and a top electrode overlying the bottom electrode structure. The top electrode has a first width as measured between outermost sidewalls of the top electrode. A ferroelectric structure separates the bottom electrode structure from the top electrode. The ferroelectric structure includes an upper ferroelectric portion having the first width, and a lower ferroelectric portion having a second width greater than the first width such that a ledge corresponds to a height where the upper ferroelectric portion meets the lower ferroelectric portion. A dielectric sidewall spacer structure is disposed on the ledge and covers outermost sidewalls of the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a bottom electrode structure;
   a top electrode overlying the bottom electrode structure, the top electrode having a first width;
   a ferroelectric structure separating the bottom electrode structure from the top electrode, the ferroelectric structure having a second width that is greater than the first width such that the ferroelectric structure includes a ledge that reflects a difference between the first width and the second width;
   a dielectric sidewall spacer structure disposed on the ledge and covering outermost sidewalls of the top electrode;
   a hardmask over an upper surface of the top electrode, wherein an upper point of the dielectric sidewall spacer structure and an upper surface of the hardmask are level with one another such that a total height of the dielectric sidewall spacer structure is equal to a difference in height between the ledge and the upper surface of the hardmask; and a conductive residue disposed along outermost sidewalls of the dielectric sidewall spacer structure, along the outermost sidewalls of the ferroelectric structure, and along outermost sidewalls of the bottom electrode structure.

2. The memory device of claim 1, wherein the ferroelectric structure includes an upper ferroelectric portion having the first width, and a lower ferroelectric portion having the second width, and the ledge corresponds to a height where the upper ferroelectric portion meets the lower ferroelectric portion.

3. The memory device of claim 2, wherein the ledge is spaced apart from an uppermost surface of the ferroelectric structure by a distance that is approximately 5% to approximately 30% of a total height of ferroelectric structure.

4. The memory device of claim 1, further comprising:
a first dielectric liner along outermost sidewalls of the dielectric sidewall spacer structure and over the upper surface of the hardmask.

5. The memory device of claim 4, wherein the first dielectric liner comprises silicon carbide.

6. The memory device of claim 4, further comprising:
a second dielectric liner along outermost sidewalls of the first dielectric liner and over an upper surface of the first dielectric liner.

7. The memory device of claim 6, further comprising:
a metal line extending over the top electrode; and
a conductive via extending through the hardmask, the first dielectric liner, and the second dielectric liner to electrically couple the metal line to the top electrode.

8. A memory device, comprising:
a bottom electrode structure;
a top electrode overlying the bottom electrode structure, the top electrode having a first width as measured between outermost sidewalls of the top electrode;
a ferroelectric structure separating the bottom electrode structure from the top electrode, wherein the ferroelectric structure includes an upper ferroelectric portion having the first width, and a lower ferroelectric portion having a second width greater than the first width such that a ledge corresponds to a height where the upper ferroelectric portion meets the lower ferroelectric portion;
a dielectric sidewall spacer structure disposed on the ledge and covering outermost sidewalls of the top electrode; and
a conductive residue disposed along outermost sidewalls of the dielectric sidewall spacer structure, along outermost sidewalls of the ferroelectric structure, and along outermost sidewalls of the bottom electrode structure.

9. The memory device of claim 8, further comprising:
a dielectric hardmask disposed over the top electrode and disposed within inner sidewalls of the dielectric sidewall spacer structure.

10. The memory device of claim 9, further comprising:
a first liner along outermost sidewalls of the dielectric sidewall spacer structure and over an upper surface of the dielectric hardmask;
a second liner along outermost sidewalls of the first liner and over an upper surface of the first liner, the second liner having a second composition that differs from a first composition of the first liner; and a via that extends though the dielectric hardmask, through the first liner, and through the second liner to make electrical contact with the top electrode.

11. The memory device of claim 8, wherein the ledge is spaced apart from an uppermost surface of the ferroelectric structure by a distance that is approximately 5% to approximately 30% of a total height of ferroelectric structure.

12. The memory device of claim 8, wherein the conductive residue includes a chemical species, and the ferroelectric structure includes the chemical species.

13. A memory device, comprising:
a bottom electrode structure;
a top electrode overlying the bottom electrode structure, the top electrode having a first width;
a ferroelectric structure separating the bottom electrode structure from the top electrode, the ferroelectric structure having a second width that is greater than the first width such that the ferroelectric structure includes a ledge that reflects a difference between the first width and the second width; and
a dielectric sidewall spacer structure disposed on the ledge and covering outermost sidewalls of the top electrode;
a conductive residue disposed along outermost sidewalls of the dielectric sidewall spacer structure, along the outermost sidewalls of the ferroelectric structure, and along outermost sidewalls of the bottom electrode structure; and
a first dielectric liner along an upper surface and outer sidewalls of the conductive residue;
a low-k dielectric structure disposed over an upper surface and outer sidewalls of the first dielectric liner, wherein the first dielectric liner separates the conductive residue from the low-k dielectric structure.

14. The memory device of claim 13, wherein the ferroelectric structure includes an upper ferroelectric portion having the first width, and a lower ferroelectric portion having the second width, and the ledge corresponds to a height where the upper ferroelectric portion meets the lower ferroelectric portion.

15. The memory device of claim 13, further comprising:
a hardmask over the upper surface of the top electrode, wherein at least one of the conductive residue or the first dielectric liner extend over an upper surface of the hardmask.

16. The memory device of claim 15, further comprising:
a second dielectric liner along outermost sidewalls of the first dielectric liner and over the upper surface of the first dielectric liner.

17. The memory device of claim 16, further comprising:
a metal line extending over the top electrode; and
a conductive via extending through the hardmask, the conductive residue, the first dielectric liner, and the second dielectric liner to electrically couple the metal line to the top electrode.

18. The memory device of claim 9, wherein an upper point of the dielectric sidewall spacer structure and an upper surface of the dielectric hardmask are level with one another such that a total height of the dielectric sidewall spacer structure is equal to difference in height between the ledge and the upper surface of the top electrode.

19. The memory device of claim 15, wherein an upper point of the dielectric sidewall spacer structure and the upper surface of the hardmask are level with one another such that a total height of the dielectric sidewall spacer structure is equal to difference in height between the ledge and the upper surface of the top electrode.

20. The memory device of claim 15, wherein the dielectric sidewall spacer structure and the hardmask are made of the same material as one another.

* * * * *